United States Patent
Lee

(10) Patent No.: US 9,141,088 B1
(45) Date of Patent: Sep. 22, 2015

(54) TIME-TO-DIGITAL CONVERTER AND OPERATION METHOD THEREOF

(71) Applicant: Winbond Electronics Corp., Taichung (TW)

(72) Inventor: Chen-Yi Lee, Hsinchu (TW)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 14/488,302

(22) Filed: Sep. 17, 2014

(51) Int. Cl.
*G04F 10/00* (2006.01)
*H03L 7/08* (2006.01)

(52) U.S. Cl.
CPC .......... *G04F 10/005* (2013.01); *H03L 7/08* (2013.01)

(58) Field of Classification Search
CPC ........ G04F 10/005; G04F 1/005; H03M 1/12; H03M 1/00; H03L 7/08; H03L 2207/50; H03L 2207/06
USPC .................................. 341/155, 142, 166, 131
See application file for complete search history.

(56) References Cited

U.S. PATENT DOCUMENTS

| | | | |
|---|---|---|---|
| 7,205,924 B2* | 4/2007 | Vemulapalli et al. | 341/166 |
| 8,022,849 B2* | 9/2011 | Zhang et al. | 341/142 |
| 8,023,363 B2 | 9/2011 | Huang et al. | |
| 8,138,843 B2* | 3/2012 | Straayer et al. | 331/57 |
| 8,331,520 B2* | 12/2012 | Ueda et al. | 375/376 |
| 8,433,025 B2 | 4/2013 | Sun et al. | |
| 8,531,322 B2 | 9/2013 | Cao et al. | |
| 2011/0148676 A1* | 6/2011 | Waheed et al. | 341/131 |
| 2011/0187907 A1* | 8/2011 | Takahashi | 348/302 |

FOREIGN PATENT DOCUMENTS

| | | |
|---|---|---|
| CN | 101594149 | 12/2009 |
| TW | I363499 | 5/2012 |
| WO | 2013034770 | 3/2013 |

OTHER PUBLICATIONS

Chung et al, "An all-digital phase-locked loop for high-speed clock generation," IEEE Journal of Solid-State Circuits, Feb. 2003, pp. 347-pp. 351.

Hsu et al., "An all-digital phase-locked loop (ADPLL)-based clock recovery circuit," IEEE Journal of Solid-State Circuits, Aug. 1999, pp. 1063-1073.

* cited by examiner

Primary Examiner — Jean B Jeanglaude
(74) Attorney, Agent, or Firm — Jianq Chyun IP Office

(57) ABSTRACT

A time-to-digital converter adopted to transform an enabled time of a time signal into an output data and an operation method thereof are provided. The operation method includes the following steps: providing a counter clock signal by a digital phase locked loop according to a reference clock signal; providing a counter result by a counter unit according to the counter clock signal and the time signal; comparing the enabled time of the time signal with a minimum time to provide a comparison result by a comparator unit; and outputting the counter result as the output data according to the comparison result when the enabled time of the time signal is longer than the minimum time.

17 Claims, 2 Drawing Sheets

TIME-TO-DIGITAL CONVERTER AND OPERATION METHOD THEREOF

BACKGROUND OF THE INVENTION

1. Field of the Invention

The invention relates to a data converter and an operation method thereof. More particularly, the invention relates to a time-to-digital converter and an operation method thereof.

2. Description of Related Art

Internet of Things (IOT) is a network, which allows all of ordinary physical objects capable of being addressed independently to carry out interconnections and intercommunications based on information carriers such as Internet and a traditional communication network, wherein IOT is generally a wireless network. In other words, all of articles may be connected to each other by the Internet and informational sensing devices, such as radio frequency identification (RFID), such that intelligent identification and management are fulfilled.

In IOT, the wireless technology is used for detecting changes in the surroundings through a wireless sensor network, wherein the wireless sensor technology provides data corresponding to the changes of the surroundings via a combination of a sensor and a wireless network, such that personnel/devices may determine changes in the surroundings with the data. In addition, with advancement of the wireless communication technology, the technique of transmitting data by a length of an enabled time of a signal is gradually come to maturity, and is less interfered with ambient noises. Accordingly, how to convert an enabled time of a signal into a digital data has become one of major technologies in terms of developing IOT.

SUMMARY OF THE INVENTION

The invention provides a time-to-digital converter and an operation method thereof, which may self-adjust resolution of time conversion, such that application range and representation of the time-to-digital converter are enhanced.

The time-to-digital converter of the invention is configured for transforming an enabled time of a time signal into an output data, which includes a comparator unit, a digital phase locked loop, and a counter unit. The comparator unit is configured for comparing the enabled time of the time signal with a minimum time to provide a comparison result. The digital phase locked loop receives a reference clock signal to provide a counter clock signal. The counter unit receives the counter clock signal to provide a counter result according to the counter clock signal and the time signal. The counter result is outputted as the output data according to the comparison result when the enabled time of the time signal is longer than the minimum time.

The operation method of the time-to-digital converter of the invention is configured for transforming an enabled time of a time signal into an output data, which includes the following steps: providing a counter clock signal by a digital phase locked loop according to a reference clock signal; providing a counter result by a counter unit according to the counter clock signal and the time signal; comparing the enabled time of the time signal with a minimum time by a comparator unit; outputting the counter result as the output data according to the comparison result when the enabled time of the time signal is longer than the minimum time.

In light of the above, in the embodiments of the invention illustrating a time-to-digital converter and an operation method thereof, a digital phase locked loop provides a counter clock signal according to a reference clock signal, and a counter unit provides a counter result according to the counter clock signal and a time signal. In addition, when an enabled time of the time signal is longer than a minimum time, the counter result is outputted as an output data. Accordingly, resolution of the output data may be adjusted by the digital phase locked loop, such that application range and representation of the time-to-digital converter are enhanced.

Several exemplary embodiments accompanied with figures are described in detail below to further describe the invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
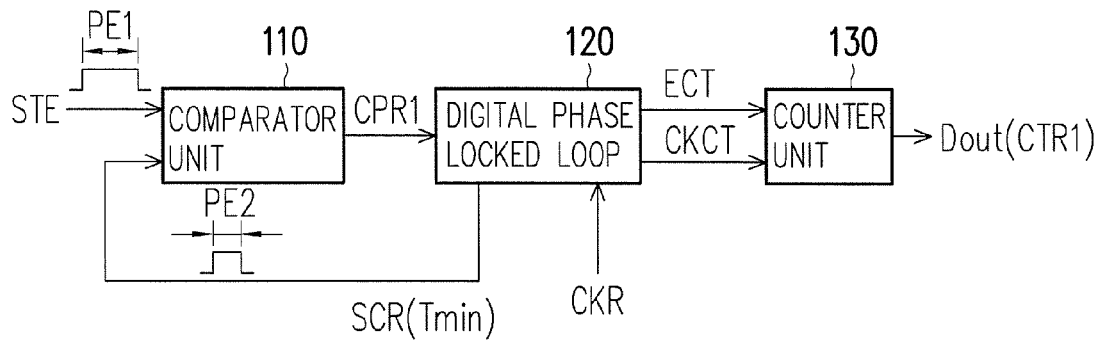
FIG. 1 is a schematic diagram illustrating a system of a time-to-digital converter according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram illustrating a system of a time-to-digital converter according to an embodiment of the invention. With reference to FIG. 1, a time-to-digital converter 100 of the present embodiment includes a comparator unit 110, a digital phase locked loop 120, and a counter unit 130. The comparator unit 110 receives a time signal STE and a comparison reference signal SCR representing a minimum time Tmin, and is configured for comparing an enabled time PE1 of the time signal STE with the minimum time Tmin to provide a comparison result CPR1. In the present embodiment, an enabled time PE2 of the comparison reference signal SCR is set to be equal to the minimum time Tmin, such that the comparator unit 110 may determine a voltage level of the comparison result CPR1 by comparing whether the enabled time PE1 is longer than the enabled time PE2. In addition, the comparator unit 110 may convert the enabled time PE1 and the enabled time PE2 into corresponding voltage levels or a digital data for comparisons, but the embodiments of the invention are not limited thereto.

When the enabled time PE1 of the time signal STE is shorter than or equal to the minimum time Tmin, it indicates that the time signal STE does not transmit data or a transmitted data may be caused by noise. Thus, the comparator unit 110 may output the comparison result CPR1 as a disabled level (i.e., a low voltage level) so as to avoid providing an inaccurate output data Dout. When the enabled time PE1 of the time signal STE is longer than the minimum time Tmin, it indicates that data transmitted by the time signal STE is valid. Accordingly, the comparator unit 110 may output the time signal STE as the comparison result CPR1. Namely, a waveform of the comparison result CPR1 is the same as a waveform of the time signal STE.

The digital phase locked loop 120 is coupled to the comparator unit 110 to receive the comparison result CPR1, and outputs the comparison result CPR1 as a counter enable signal ECT. Namely, a waveform of the counter enable signal ECT is the same as the waveform of the outputted comparison result CPR1. In addition, the digital phase locked loop 120 receives a reference clock signal CKR to provide a counter clock signal CKCT. Namely, frequency of the counter clock signal CKCT is in direct proportion to frequency of the reference clock signal CKR, wherein, the frequency of the reference clock signal CKR may be different from the frequency of the counter clock signal CKCT, and the frequency of the counter clock signal CKCT may be higher than the frequency of the reference clock signal CKR, but the embodiments of the invention are not limited thereto.

The counter unit 130 is coupled to the digital phase locked loop 120 to receive the counter enable signal ECT and the counter clock signal CKCT, and to generate a counter result CTR1 by counting pulse numbers of the counter enable signal CKCT according to the counter enable signal ECT. At this time, since the waveform of the counter enable signal ECT is the same as the waveform of the time signal STE, the counter result CTR1 corresponds to the enabled time PE1 of the time signal STE. In the present embodiment, since the counter result CTR1 of the counter unit 130 has been regarded as a digital data, the counter unit 130 may directly output and lock the counter result CTR1 as the output data Dout. Accordingly, the time-to-digital converter 100 may convert the enabled time PE1 of the time signal STE into the output data Dout, and may adjust resolution of the output data Dout by frequency of the digital phase locked loop 120, so as to enhance application range and representation of the time-to-digital converter 100.

In summarizing the above, the comparator unit 110 of the time-to-digital converter 100 may compare the enabled time PE1 of the time signal STE with the minimum time Tmin to provide the comparison result CPR1. The digital phase locked loop 120 may receive the reference clock signal CKR to provide the counter clock signal CKCT, and the counter unit 130 may receive the counter clock signal CKCT to provide the counter result CTR1 by counting clock of the counter clock signal CKCT according to the time signal STE. Furthermore, when the enabled time PE1 of the time signal STE is longer than the minimum time Tmin, the digital phase locked loop 120 and the counter unit 130 may provide the counter result CTR1 as the output data Dout according to the comparison result CPR1. When the enabled time PE1 of the time signal STE is shorter than or equal to the minimum time Tmin, the digital phase locked loop 120 and the counter unit 130 are not activated, i.e. the output data Dout is not provided.

In the present embodiment, the comparison reference signal SCR, for example, is provided by the digital phase locked loop 120. Namely, the comparison reference signal SCR may vary with the reference clock signal CKR, but the embodiments of the invention are not limited thereto.

Figure 2:
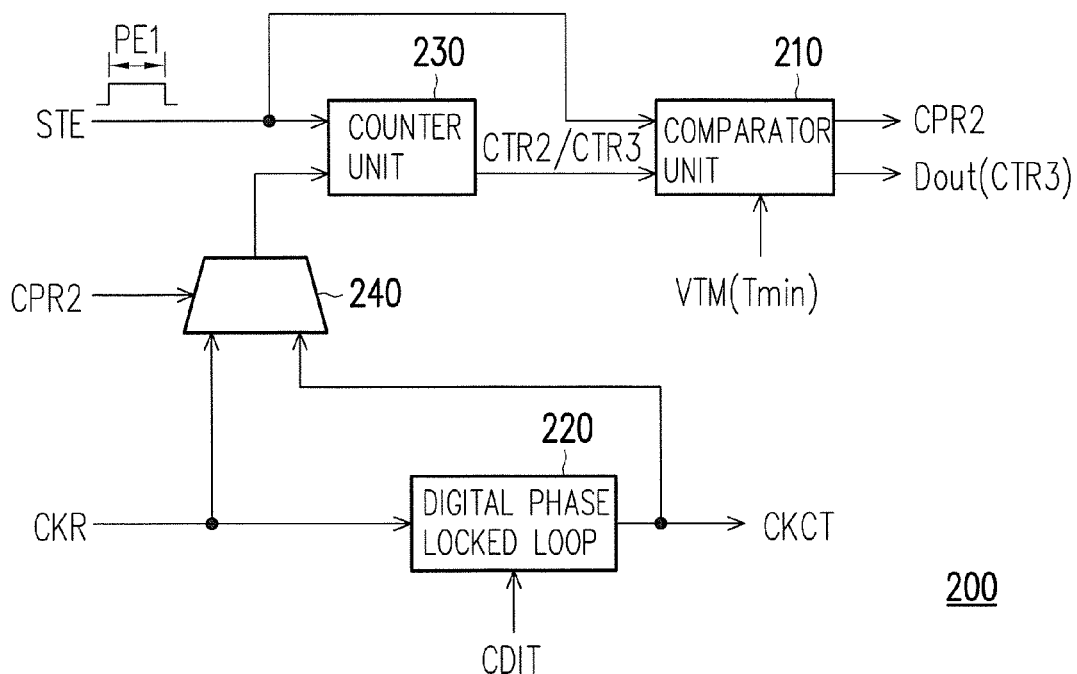
FIG. 2 is a schematic diagram illustrating a system of a time-to-digital converter according to another embodiment of the invention.

FIG. 2 is a schematic diagram illustrating a system of a time-to-digital converter according to another embodiment of the invention. With reference to FIG. 2, the time-to-digital converter 200 of the present embodiment includes a comparator unit 210, a digital phase locked loop 220, a counter unit 230, and a multiplexer 240, wherein a comparison result CPR2 of the comparator unit 210 is preset to be a disabled level (i.e., a low voltage level).

The time-to-digital converter 200 is preset to be at a time detection mode (corresponding to the disabled level of the comparison result CPR2) to detect whether the enabled time PE1 of the time signal STE is valid. When the enabled time PE1 of the time signal STE is valid (corresponding to an enabled level of the comparison result CPR2, such as a high voltage level), the time-to-digital converter 200 is switched to a data conversion mode to convert the enabled time PE1 of the time signal STE into the output data Dout.

The digital phase locked loop 220 receives the reference clock signal CKR and a segment assignation code CDIT to generate the counter clock signal CKCT according to the reference clock signal CKR and the segment assignation code CDIT. Namely, the frequency of the counter clock signal CKCT is pertinent to frequency of the reference clock signal CKR and the segment assignation code CDIT, wherein the segment assignation code CDIT is configured for setting a frequency gain value of the digital phase locked loop 220. Namely, the higher frequency gain value of the digital phase locked loop 220, the shorter time interval of pulses of the counter clock signal CKCT; and the lower frequency gain value of the digital phase locked loop 220, the longer time interval of pulses of the counter clock signal CKCT. Setting of the counter clock signal CKCT may be determined by those skilled in the art, and the embodiments of the invention are not limited thereto.

The multiplexer 240 receives the reference clock signal CKR, and is coupled to the digital phase locked loop 220 to receive the counter clock signal CKCT. The multiplexer 240 provides the reference clock signal CKR or the counter clock signal CKCT to the counter unit 230 according to the comparison result CPR2 of the comparator unit 210.

When the time-to-digital converter 200 is at the time detection mode, the multiplexer 240 transmits the reference clock signal CKR to the counter unit 230 under control of the comparison result CPR2, and the counter unit 230 provides a reference counter result CTR2 according to the reference clock signal CKR and the time signal STE after receiving the reference clock signal CKR and the time signal STE. The comparator unit 210 is coupled to the counter unit 230 and receives the time signal STE and the reference counter result CTR2. The comparator unit 210 then compares the reference counter result CTR2 with a minimum time counter value VTM corresponding to the minimum time Tmin to provide the comparison result CPR2.

When the reference counter result CTR2 is less than or equal to the minimum time counter value VTM, the comparison result CPR2 maintains at the disabled level. Namely, the time-to-digital converter 200 is still at the time detection mode. When the reference counter result CTR2 is greater than the minimum time counter value VTM, the comparison result CPR2 is switched to the enabled level, and the time-to-digital converter 200 is correspondingly switched to the data conversion mode.

When the time-to-digital converter 200 is switched to the data conversion mode, the multiplexer 240 transmits the counter clock signal CKCT to the counter unit 230 under control of the comparison result CPR2, and the counter unit 230 provides a counter result CTR3 according to the counter clock signal CKCT and the time signal STE after receiving the counter clock signal CKCT and the time signal STE. The comparator unit 210 outputs and locks the counter result CTR3 as the output data Dout after receiving the counter result CTR3. Accordingly, the time-to-digital converter 200 may convert the enabled time PE1 of the time signal STE into the output data Dout, and may adjust resolution of the output data Dout by the segment assignation code CDIT to enhance application range and representation of the time-to-digital converter 200.

In summarizing the above, the comparator unit 210 of the time-to-digital converter 200 may compare the enabled time PE1 of the time signal STE with the minimum time Tmin to provide the comparison result CPR2. The digital phase locked loop 220 may receive the reference clock signal CKR to provide the counter clock signal CKCT. The counter unit 230 may receive the counter clock signal CKCT to provide the counter result CTR3 by counting clock of the counter clock signal CKCT according to the time signal STE. Moreover, when the enabled time PE1 of the time signal STE is longer than the minimum time Tmin, the digital phase locked loop 220 and the counter unit 230 may provide the counter result CTR3 according to the comparison result CPR2, and the comparator unit 210 may output the counter result CTR3 as the output data Dout. When the enabled time PE1 of the time signal STE is shorter than or equal to the minimum time Tmin, the comparator unit 210 does not provide the output data Dout.

Figure 3:
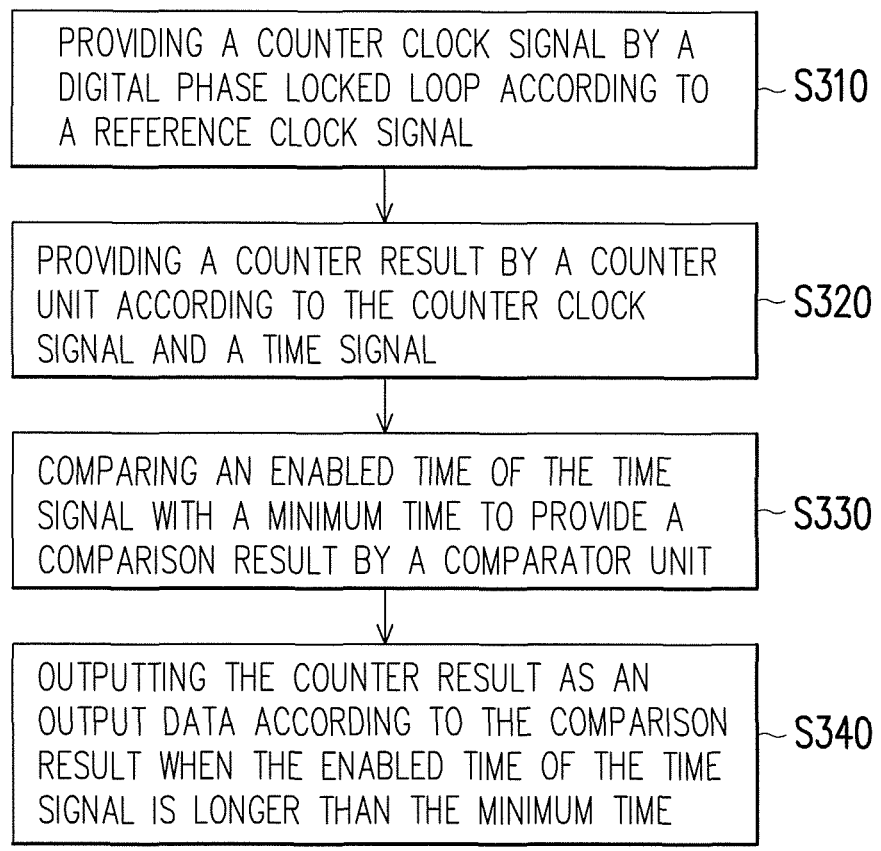
FIG. 3 is a flow chart illustrating an operation method of a time-to-digital converter according to an embodiment of the invention.

FIG. 3 is a flow chart illustrating an operation method of a time-to-digital converter according to an embodiment of the invention. With reference to FIG. 3, a time-to-digital converter of the present embodiment is configured for transforming an enabled time of a time signal into an output data, and an operation method of the time-to-digital converter includes the following steps: providing a counter clock signal by a digital phase locked loop according to a reference clock signal (Step S310); providing a counter result by a counter unit according to the counter clock signal and a time signal (Step S320); comparing an enabled time of the time signal with a minimum time to provide a comparison result by a comparator unit (Step S330); outputting the counter result as an output data according to the comparison result when the enabled time of the time signal is longer than the minimum time (Step S340). Here, orders of the above steps S310, S320, S330, and S340 are used for illustrations, and the embodiments of the invention are not limited thereto. Besides, details of the above steps S310, S320, S330, and S340 may be referred to the embodiments as illustrated in FIG. 1 and FIG. 2, and are not reiterated herein.

In summarizing the above, the embodiments of the invention disclose a time-to-digital converter and an operation method thereof. A digital phase locked loop provides a counter clock signal according to a reference clock signal, and the counter unit provides a counter result according to the counter clock signal and a time signal. In addition, when an enabled time of the time signal is longer than a minimum time, the counter result is outputted as an output data. Accordingly, resolution of the output data may be adjusted by the reference clock signal, such that application range and representation of the time-to-digital converter are enhanced.

What is claimed is:

1. A time-to-digital converter configured for transforming an enabled time of a time signal into an output data, comprising:
    a comparator unit configured for comparing the enabled time of the time signal with a minimum time to provide a comparison result;
    a digital phase locked loop for receiving a reference clock signal to provide a counter clock signal; and
    a counter unit for receiving the counter clock signal to provide a counter result according to the counter clock signal and the time signal;
    wherein the counter result is outputted as the output data according to the comparison result when the enabled time of the time signal is longer than the minimum time.

2. The time-to-digital converter as claimed in claim 1, wherein the comparator unit receives the time signal and a comparison reference signal representing the minimum time, the comparator unit outputs the time signal as the comparison result when the enabled time of the time signal is longer than the minimum time, the comparator unit outputs the comparison result as a disabled level when the enabled time of the time signal is shorter than or equal to the minimum time,
    the digital phase locked loop receives the comparison result, and outputs the comparison result as a counter enable signal,
    the counter unit receives the counter clock signal and the counter enable signal to count according to the counter clock signal and the counter enable signal, and the counter unit outputs and locks the counter result as the output data.

3. The time-to-digital converter as claimed in claim 2, wherein the digital phase locked loop provides the comparison reference signal.

4. The time-to-digital converter as claimed in claim 2, wherein an enabled time of the comparison reference signal is equal to the minimum time.

5. The time-to-digital converter as claimed in claim 1, wherein when the time-to-digital converter is at a time detection mode, the counter unit receives the reference clock signal and the time signal to provide a reference counter result, the comparator unit compares the reference counter result with a minimum time counter value corresponding to the minimum time to provide the comparison result,
    when the time-to-digital converter is at a data conversion mode, the counter unit receives the counter clock signal and the time signal to provide the counter result, the comparator unit receives the counter result to output and lock the counter result as the output data,
    wherein the time-to-digital converter is set at the time detection mode or the data conversion mode according to the comparison result.

6. The time-to-digital converter as claimed in claim 5, wherein the time-to-digital converter is preset at the time detection mode, and when the reference counter result is greater than the minimum time counter value, the time-to-digital converter is switched to the data conversion mode.

7. The time-to-digital converter as claimed in claim 5, wherein the digital phase locked loop generates the counter clock signal according to the reference clock signal and a segment assignation code.

8. The time-to-digital converter as claimed in claim 5, further comprising a multiplexer for receiving the reference clock signal and the counter clock signal to provide the reference clock signal or the counter clock signal to the counter unit according to the comparison result.

9. The time-to-digital converter as claimed in claim 1, wherein frequency of the counter clock signal is higher than frequency of the reference clock signal.

10. An operation method of a time-to-digital converter configured for transforming an enabled time of a time signal into an output data, comprising:
    providing a counter clock signal by a digital phase locked loop according to a reference clock signal;
    providing a counter result by a counter unit according to the counter clock signal and the time signal;
    comparing the enabled time of the time signal with a minimum time to provide a comparison result by a comparator unit; and
    outputting the counter result as the output data according to the comparison result when the enabled time of the time signal is longer than the minimum time.

11. The operation method of the time-to-digital converter as claimed in claim 10, further comprising:

comparing the time signal with a comparison reference signal representing the minimum time by the comparator unit;

outputting the time signal as the comparison result by the comparator unit when the enabled time of the time signal is longer than the minimum time;

outputting the comparison result as a disabled level by the comparator unit when the enabled time of the time signal is shorter than or equal to the minimum time;

transmitting the comparison result as a counter enable signal by the digital phase locked loop; and counting by the counter unit according to the counter clock signal and the counter enable signal, and outputting and locking the counter result as the output data by the counter unit.

12. The operation method of the time-to-digital converter as claimed in claim 11, further comprising:

providing the comparison reference signal by the digital phase locked loop.

13. The operation method of the time-to-digital converter as claimed in claim 11, wherein an enabled time of the comparison reference signal is equal to the minimum time.

14. The operation method of the time-to-digital converter as claimed in claim 10, further comprising:

providing a reference counter result by the counter unit according to the reference clock signal and the time signal when the time-to-digital converter is at a time detection mode, and comparing the reference counter result with a minimum time counter value corresponding to the minimum time to provide the comparison result by the comparator unit;

providing the counter result by the counter unit according to the counter clock signal and the time signal when the time-to-digital converter is at a data conversion mode, transmitting and locking the counter result as the output data by the comparator unit; and setting the time-to-digital converter at the time detection mode or the data conversion mode according to the comparison result.

15. The operation method of the time-to-digital converter as claimed in claim 14, further comprising:

presetting the time-to-digital converter at the time detection mode; and switching the time-to-digital converter to the data conversion mode when the reference counter result is greater than the minimum time counter value.

16. The operation method of the time-to-digital converter as claimed in claim 14, further comprising:

generating the counter clock signal by the digital phase locked loop according to the reference clock signal and a segment assignation code.

17. The operation method of the time-to-digital converter as claimed in claim 10, wherein frequency of the counter clock signal is higher than frequency of the reference clock signal.

* * * * *